ELECTRICAL TERMINATION FOR A TANTALUM NITRIDE FILM

Filed March 9, 1969

INVENTOR

P. M. Johnson, Jr.,

BY D. W. Marks

ATTORNEY

United States Patent Office 3,495,959

Patented Feb. 17, 1970

3,495,959

ELECTRICAL TERMINATION FOR A TANTALUM NITRIDE FILM

Paul M. Johnson, Jr., Winston-Salem, N.C., assignor to Western Electric Company, Incorporated, New York, N.Y., a corporation of New York Filed Mar. 9, 1967, Ser. No. 621,863

Int. Cl. B23p 3/20; H01l 5/00

U.S. Cl. 29—195 4 Claims

ABSTRACT OF THE DISCLOSURE

A readily solderable contact termination for a film component made by plating successive layers of chromium or nickel-chromium alloy, palladium, platinum, ruthenium or rhodium and gold by evaporation onto a tantalum nitride film on a substrate.

BACKGROUND OF THE INVENTION

In the manufacture of film components, such as tantalum nitride film resistors, a film, such as a tantalum nitride film, is sputtered onto a surface of a substrate. Next, terminations are plated by evaporation onto the end portions of the film. In the manufacture of tantalum nitride resistors, the tantalum nitride film is then heated to 475° C. in an atmosphere containing oxygen for one to two minutes to stabilize the resistance and form a protective oxide layer on the exposed tantalum nitride film. Subsequently, a lead is soldered to the termination.

Using prior art terminations, it was discovered that the heat applied to stabilize the resistance reduced the solderability of these prior art terminations. For example, one prior art termination consisted of successive layers of chromium and gold. Another prior art termination consisted of successive layers of 80% nickel–20% chromium alloy, copper and palladium. The application of heat to these prior art terminations during the stabilization of the tantalum nitride film produced terminations to which solder would not readily adhere, and the application of force to leads soldered on these prior art terminations resulted in the separation of the soldered lead from the termination.

SUMMARY OF THE INVENTION

Accordingly, an object of the invention is a new and improved termination which will retain its solderabilty after beng subjected to heat.

With these and other objects in view, the present invention contemplates a termination made by the successive application of a first layer of chromium or nickel-chromium alloy, containing up to 80% nickel, a second layer of palladium and a third layer of gold onto a conductive film on a substrate.

DETAILED DESCRIPTION

Figures 1, 2:
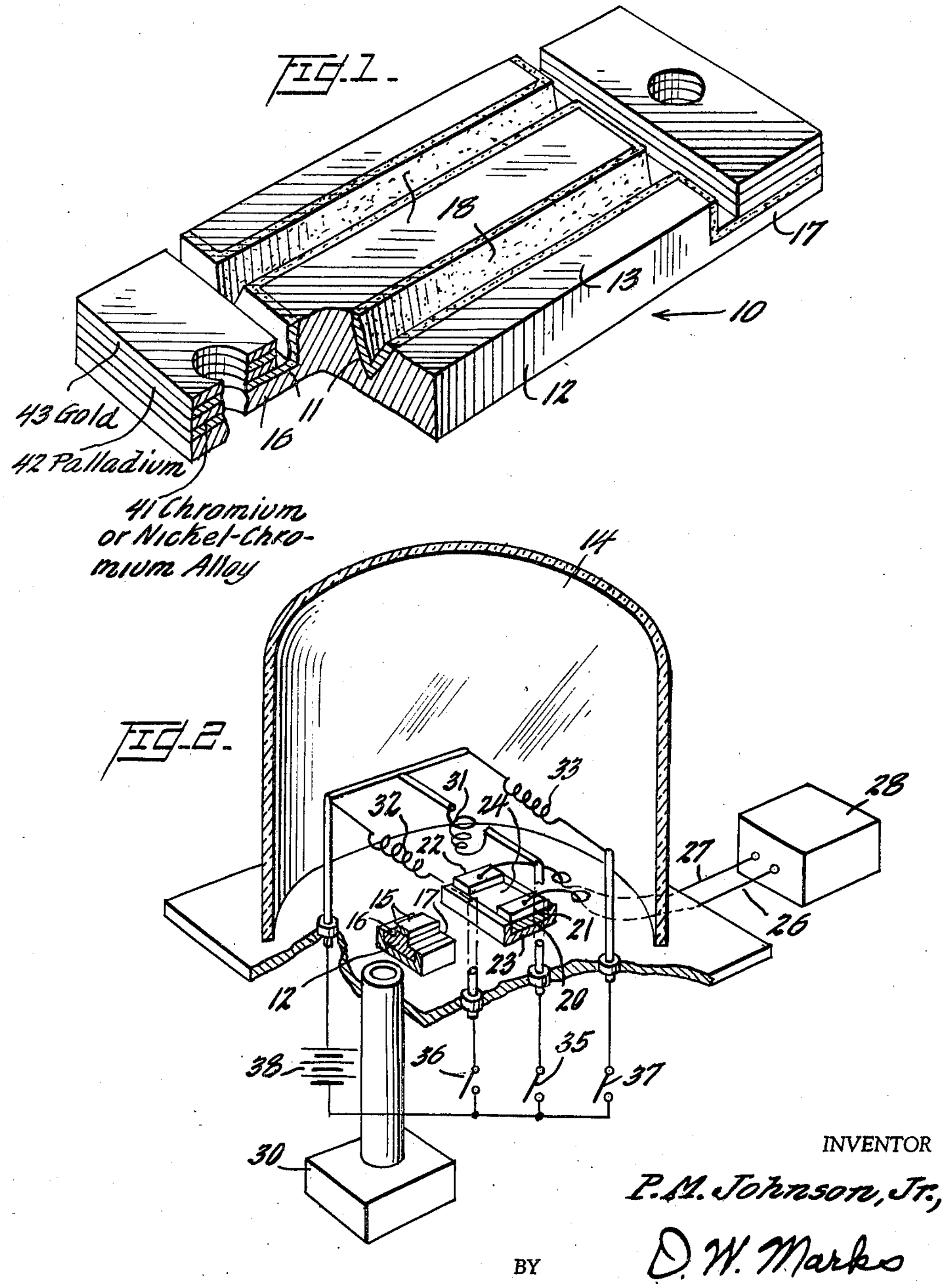
In FIG. 1 there is shown in exaggerated proportions a typical component having terminations embodying the present invention.
In FIG. 2, there is shown an apparatus which may be used to make terminations embodying the present invention.

In the manufacture of a film component 10 (FIG. 1), such as a discrete tantalum nitride resistor, a film 11, such as tantalum nitride, is deposited on the upper surface 13 of a substrate 12. For example, D. Gerstenberg Patent 3,242,006, which issued Mar. 22, 1966 and which is assigned to Bell Telephone Laboratories, Inc., shows the deposition by sputtering of a tantalum nitride film on a substrate. The substrate 12 may be ceramic, glass, or another suitable non-conductive material. Grooves 18 may be formed in the upper surface 13 so that the resistive film 11 on the upper surface 13 may be subsequently abraded, leaving a resistance path of film 11 in the grooves 18 having a predetermined resistance.

Referring to FIG. 2, the substrate 12 with the tantalum nitride film 11, as shown in FIG. 1, plated thereon is positioned within a vacuum chamber 14, and a mask 15 is placed over the substrate 12 such that only the film 11 on end portions 16 and 17 of the substrate 12 is exposed. The mask 15 may be made from any suitable material, such as metal, which prevents or blocks the deposition of evaporated metal on the non-exposed portions of the substrate 12.

Films of desired thicknesses may be deposited by utilizing measured amounts of metal in suitable evaporation apparatus or by controlling the evaporation by a timing device or a monitoring device. One such monitoring device utilizes a substrate 20 having conductive terminals 21 and 22 deposited on end portions thereof which is positioned in the vacuum chamber 14. A suitable mask 23 is placed over the substrate 20 such that the terminals 21 and 22 and a bare substrate surface 24 is exposed. The terminals 21 and 22 are positioned such that the bare surface 24 is approximately a square. Leads 26 and 27 are attached to the terminals 21 and 22 to connect the terminals across a resistance measuring device 28.

Next, the vacuum chamber 14 is evacuated by the operation of a vacuum pumping system 30 to produce a pressure of approximately $10^{-6}$ mm. Hg in the chamber 14. The vacuum pumping system may be a conventional arrangement of roughing and diffusion pumps connected by suitable valves to the chamber 14.

Three tungsten filaments 31, 32 and 33 are located in the chamber 14 for successively evaporating chromium or nickel-chromium alloy, palladium and gold. Switches 35, 36 and 37 are provided for selectively connecting respective filaments 31, 32 and 33 to a power source 38.

First, the switch 35 is closed to heat the filament 31 and evaporate chromium or nickel-chromium alloy placed within the filament 31. When chromium is evaporated, the filament 31 is preferably a conical basket positioned directly over the masked substrate 12. For evaporating nickel-chromium alloy, the filament 31 may be helical and need not be centered over the substrate 12. Evaporated chromium or nickel-chromium alloy is deposited onto the exposed surface of the tantalum nitride film 11 on the substrate 12 and onto the exposed square 24 of the substrate 20. The resistance of the square is monitored until it reaches a predetermined resistance, at which time the power to the filament 31 is turned off and the evaporation of chromium or nickel-chromium alloy stopped. The deposited chromium or nickel-chromium alloy forms a layer 41 on the exposed end portions of the tantalum nitride film 11 as shown in FIG. 1.

Chromium and nickel-chromium alloy are both known for their ability to form strong bonds to metallic films. In the production of a chromium or nickel-chromium alloy, palladium and gold termination, a layer 41 of chromium or nickel-chromium alloy less than 100 A. thick does not form a continuous film on the tantalum nitride film 11 and thus a weak bond is formed with the underlying film 11. A layer 41 greater than 800 A. thick introduces a high resistivity and undesirable noise into the termination.

The nickel-chromium alloy may have varying amounts of nickel up to 80% by weight. Chromium is preferred over nickel-chromium alloy because it produces a stronger bond which does not deteriorate when subjected to high temperatures. Also, nickel-chromium alloys containing lesser amounts of nickel are preferred over the alloys with greater amounts of nickel because of less deterioration at high temperatures.

Next, the switch 36 is closed to heat the filament 32 and evaporate a measured amount of palladium placed in the filament 32. The evaporation of palladium deposits a palladium layer 42 on the layer 41.

Palladium, platinum, ruthenium and rhodium are known for their ability to form a barrier to the diffusion of certain metals such as copper, gold and silver. It has been found that a layer of palladium greater than 2,500 A. thick between a chromium or nickel-chromium alloy layer and a gold layer greatly improved the solderability of the gold layer by preventing the diffusion of the chromium or nickel-chromium alloy into the gold layer. When the thickness of palladium is increased above 3,500 A., the strength of the termination is reduced. Palladium is preferred because of its lower evaporation temperature.

Finally, the switch 37 is closed to heat the filament 33 and evaporate a measured amount of gold placed in the filament 33. The gold is deposited in a layer 43 on the palladium layer 42.

To produce the most desirable solderability, a layer of gold greater than 3,200 A. is needed. If the layer of gold is increased above 4,500 A., the strength of the termination is reduced.

The nickel-chromium alloy, palladium and gold termination results in a strong bond with a soldered lead so long as the termination is not subjected to temperatures much greater than 475° C. or to temperatures approximately 475° C. for long durations. The chromium, palladium and gold termination has been found to be superior and retains its solderability and strength even when subjected to higher temperatures for longer durations, whereas the nickel-chromium alloy, palladium and gold termination became weak and unsolderable at elevated temperatures or long exposure to heat.

Example 1

A substrate 12, which has a tantalum nitride film 11 deposited thereon, is placed within an evaporation chamber 14 and the pressure within the chamber reduced to approximately $10^{-6}$ mm. Hg. The substrate 12 is masked to leave only the unmasked portions of the film 11 on the ends 16 and 17 of the substrate 12 exposed.

A flat ceramic substrate 20 having metal terminals 21 and 22 deposited on end portions thereof is also placed within the evaporation chamber 14. The substrate 20 is masked to leave an exposed ceramic surface 24 between the terminals 21 and 22. Two electrodes 26 and 27 connect the terminals 21 and 22 to a resistance measuring circuit 28.

Chromium within a conical filament 31 is evaporated to deposit a layer 41 of chromium on the exposed tantalum nitride film 11. When the resistivity of chromium plated onto the exposed surface 24 of the substrate 20 reaches a predetermined resistivity, the power to the filament 31 is turned off to stop the evaporation of chromium. The predetermined resistivity is calculated so that the deposited layer 41 of chromium has a thickness of approximately 250 A.

Next, a measured amount of palladium within a helical filament 32 is completely evaporated to deposit a layer 42 of palladium on the chromium layer 41. The measured amount of palladium is calculated to deposit a thickness of approximtely 2,875 A.

After the measured amount of palladium is evaporated, a measured amount of gold within a helical filament 33 is completely evaporated to deposit a layer 42 of gold on the palladium layer 42. The amount of gold is calculated to produce a layer 43 of gold approximately 3,550 A. thick.

The chromium, palladium and gold termination formed may be subsequently heated to temperatures in excess of 475° C. for long durations without destroying its wetability to solder. A terminal soldered onto the termination, when it is subjected to sufficient force, will rupture the substrate before separating the termination from the tantalum nitride film 11.

Example 2

A substrate 12 which has a tantalum nitride film 11 deposited thereon is placed within an evaporation chamber 14 having a pressure of aproximately $10^{-6}$ mm. Hg. The substrate 12 is masked to leave only the unmasked portions of the film 11 on the ends 16 and 17 of the substrate 12 exposed.

A measured amount of 80% nickel-20% chromium alloy within a helical filament 31 is completely evaporated to deposit a layer 41 of 80% nickel-20% chromium alloy on the exposed film 11. The amount of 80% nickel-20% chromium alloy within the filament 31 is calculated to deposit a layer 41 having a thickness of approximately 225 A.

Next, a measured amount of palladium in a helical filament 32 is completely evaporated to deposit a layer 42 of palladium on the layer 41. The measured amount of palladium is calculated to deposit a thickness of approximately 2,875 A.

After the measured amount of palladium is evaporated, a measured amount of gold in a helical filament 33 is completely evaporated. The amount of gold is calculated to produce a layer 43 of gold on the palladium layer 42 of approximately 3,550 A.

The termination formed may be subsequently heated to 475° C. from one to two minutes without destroying its wetability to solder. A lead soldered onto the termination, when subjected to force, does not readily separate from the termination on the tantalum nitride film 11.

The above-described embodiments are simply illustrative of the principles of the invention, and many other embodiments may be devised without departing from the scope and spirit of the invention.

What is claimed is:

1. A termination for a tantalum nitride resistance film on a substrate comprising successively:

a first layer consisting essentially of a metal selected from the group consisting of chromium and nickel-chromium alloy containing up to 80% nickel wherein the first layer has a thickness within the range from 100 A. to 800 A.;

a second layer consisting essentially of palladium having a thickness within the range from 2,500 A. to 3,500 A.; and a third layer consisting essentially of gold having a thickness within the range from 3,200 A. to 4,500 A.

2. A termination for a tantalum nitride resistance film on a substrate comprising successively:

a layer consisting essentially of chromium having a thickness within the range from 100 A. to 800 A.;

a layer consisting essentially of palladium having a thickness within the range from 2,500 A. to 3,500 A.; and a layer consisting essentially of gold having a thickness with the range from 3,200 A. to 4,500 A.

3. A termination for a tantalum nitride resistive film on a substrate to which a strong solderable bond may be formed after heat treatment of the film in an oxygen containing atmosphere to a temperature at least about 475° C., comprising successively:

the substrate;

the tantalum nitride film;

a first layer consisting essentially of a metal selected from the group consisting of chromium and nickel-chromium alloy containing up to 80% nickel wherein the first layer has a thickness within the range from 100 to 800 angstroms;

a second layer consisting essentially of palladium having a thickness within the range from 2,500 to 3,500 angstroms; and a third layer consisting essentially of gold having a thickness with the range 3,200 to 4,500 angstroms.

4. A termination as defined in claim 3, wherein the first layer consists essentially of chromium.

References Cited

UNITED STATES PATENTS

| | | | |
|---|---|---|---|
| 3,162,512 | 12/1964 | Robinson | 29—199 |
| 3,178,270 | 4/1965 | Byrnes et al. | 29—183.5 |
| 3,290,127 | 12/1966 | Kahng et al. | 29—195 |
| 3,409,809 | 11/1968 | Diehl | 317—234 |
| 3,413,711 | 12/1968 | Brewer et al. | 29—195 X |

L. DEWAYNE RUTLEDGE, Primary Examiner

E. L. WEISE, Assistant Examiner

U.S. Cl. X.R.

29—199; 317—234